United States Patent
Weng et al.

(10) Patent No.: US 10,244,632 B2
(45) Date of Patent: Mar. 26, 2019

(54) SOLDER RESIST LAYER STRUCTURES FOR TERMINATING DE-FEATURED COMPONENTS AND METHODS OF MAKING THE SAME

(71) Applicant: INTEL CORPORATION, Santa Clara, CA (US)

(72) Inventors: Li-Sheng Weng, Chandler, AZ (US); Chi-Te Chen, Folsom, CA (US); Wei-Lun Jen, Chandler, AZ (US); Olivia Chen, Folsom, CA (US); Yun Ling, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/447,597

(22) Filed: Mar. 2, 2017

(65) Prior Publication Data

US 2018/0255640 A1  Sep. 6, 2018

(51) Int. Cl.
| | |
|---|---|
| H05K 1/18 | (2006.01) |
| H01L 23/498 | (2006.01) |
| H01L 21/48 | (2006.01) |
| H05K 3/34 | (2006.01) |
| H05K 3/28 | (2006.01) |
| H05K 1/11 | (2006.01) |

(52) U.S. Cl.
CPC ......... *H05K 1/181* (2013.01); *H01L 21/4853* (2013.01); *H01L 23/49805* (2013.01); *H01L 23/49838* (2013.01); *H05K 1/112* (2013.01); *H05K 3/28* (2013.01); *H05K 3/3436* (2013.01); *H05K 2201/10734* (2013.01)

(58) Field of Classification Search
CPC ...................... H05K 1/181; H05K 3/28; H01L 2224/13099; H01L 2224/14515; H01L 2224/14505; H01L 2224/73204
See application file for complete search history.

(56) References Cited

U.S. PATENT DOCUMENTS

| | | | |
|---|---|---|---|
| 6,650,016 B1 * | 11/2003 | MacQuarrie | ......... H01L 21/485 228/180.22 |
| 2002/0017730 A1 * | 2/2002 | Tahara | ................ H01L 23/3114 257/786 |

* cited by examiner

*Primary Examiner* — Lex H Malsawma
*Assistant Examiner* — Laura M Dykes
(74) *Attorney, Agent, or Firm* — Green, Howard & Mughal LLP

(57) ABSTRACT

A microelectronic structure may be formed comprising a microelectronic package having a plurality of interconnects and a microelectronic substrate including an upper metallization layer and a solder resist structure, wherein the solder resist structure includes a first structure which forms an electrical connection between a first interconnect of the plurality of interconnects of the microelectronic package and the upper metallization layer of the microelectronic substrate, and wherein solder resist structure includes a second structure which prevents second interconnect of the plurality of interconnects of the microelectronic package from making electrical contact with the upper metallization layer.

14 Claims, 6 Drawing Sheets

US 10,244,632 B2

SOLDER RESIST LAYER STRUCTURES FOR TERMINATING DE-FEATURED COMPONENTS AND METHODS OF MAKING THE SAME

TECHNICAL FIELD

Embodiments of the present description generally relate to the field of microelectronic structures and, more particularly, to a microelectronic structure including a microelectronic package mounted to a microelectronic substrate, wherein the microelectronic substrate includes solder resist layer structures to terminate de-featured components of the microelectronic package.

BACKGROUND

The microelectronic industry is continually striving to produced ever faster and smaller microelectronic structures for use in various mobile electronic products, such as portable computers, electronic tablets, cellular phones, digital cameras, and the like. Typically, a microelectronic device, such a microprocessor, a chipset, a graphics device, a wireless device, a memory device, an application specific integrated circuit, or the like, is attached to a microelectronic interposer, which may also have other microelectronic components, such as resistor, capacitors, and inductors, attached thereto. The interposer is, in turn, attached to a microelectronic substrate, which enables electrical communication between the microelectronic device, the microelectronic components, and external devices. As the goals for the microelectronic industry are faster and smaller microelectronic structures, there is an ever continuing effort to make the most efficient use the space on and in both the microelectronic package and the microelectronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF THE EMBODIMENTS

Figure 1:
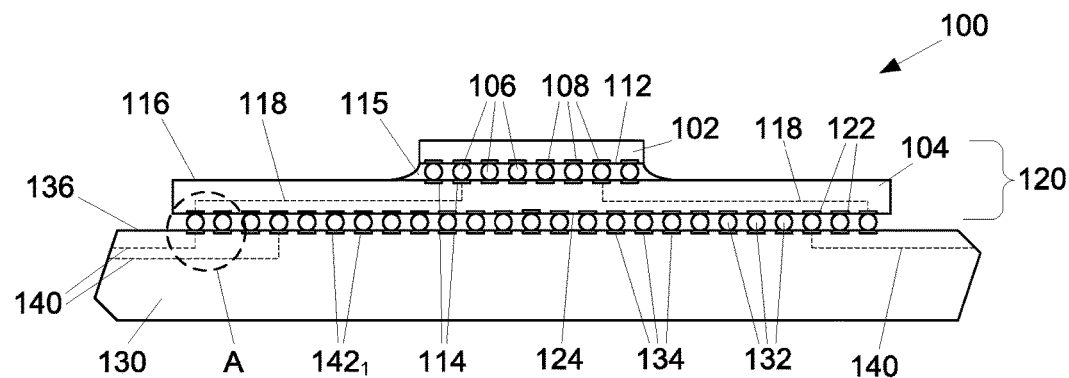
FIG. 1 illustrates a side cross-sectional view of a microelectronic structure having a microelectronic package mounted on a microelectronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Microelectronic packages are generally fabricated to include numerous components which may not necessarily used by an end-user of the package. The components that are not used by an end-user of the microelectronic package may be termed as "de-featured components", whereas components to be used by an end-user of the microelectronic paakage mayer be termed as "featured components". Microelectronic packages are usually attached to a microelectronic substrate through a plurality of interconnects, such as solder balls or pins. When a microelectronic package has a component that is not to be utilized, the interconnects associated with that de-featured component may be terminated by forming "floating pads", i.e. electrically isolated bond pads, in an uppermost metallization layer of the microelectronic substrate. However, this may result in a considerable area in the microelectronic substrate being used for the floating pads, which means that considerable space is rendered unusable for input/output signal lines and/or power delivery lines. Thus, end-users request special microelectronic packages from the manufacturers to redesign an interposer within the package to only "pin out" the featured component input/output signal lines and power delivery lines, so the package is smaller, or to remove the interconnects for the de-featured component, so that the area on the microelectronic substrate under the removed de-featured interconnect can be utilized. However, such requests add either design/validation or manufacturing complexity for the microelectronic package manufacturer.

Embodiments of the present description may include a microelectronic structure having a microelectronic package mounted to a microelectronic substrate, wherein the microelectronic substrate includes solder resist layer structures to terminate de-featured component interconnects in the solder resist structures, rather than terminating the de-featured component interconnects on floating pads on the microelectronic substrate. In one embodiment, the solder resist layer structure may be a layer of solder resist material having a plurality openings extending therethrough, wherein each of the openings has either a conductive paste or a non-conductive paste disposed therein. In another embodiment, the solder resist layer structure may be an upper solder resist material layer on a lower solder resist material layer and a plurality of openings, wherein the openings for featured components extend through both the upper solder resist material layer and the lower solder resist material layer and wherein the opening for de-featured components extend through the upper material layer and terminates at the lower solder resist material layer.

In the production of microelectronic structures, microelectronic packages are generally mounted on microelectronic substrates that provide electrical communication routes between the microelectronic packages and external components. As shown in FIG. 1, in one embodiment, at least one microelectronic device 102, such as a microprocessor, a chipset, a controller, a graphics device, a wireless device, a memory device, an application specific integrated circuit, or the like, may be attached to a microelectronic interposer 104 through a plurality of interconnects 106, to form a microelectronic package 120. The device-to-interposer interconnects 106 may extend between bond pads 108 on an active surface 112 of the microelectronic device 102 and substantially mirror-image bond pads 114 on a die side surface 116 of the microelectronic interposer 104. The microelectronic device bond pads 108 may be in electrical communication with integrated circuitry (not shown) within the microelectronic device 102. The microelectronic interposer bond pads 114 may be in electrical communication with conductive routes (shown as dashed lines 118) within the microelectronic interposer 104. The microelectronic interposer conductive routes 118 may provide electrical communication routes to bond pads 122 on a land side surface 124 of the microelectronic interposer 104.

As still further shown in FIG. 1, an electrically-insulating flowable material, such as an underfill material 115, may be disposed between the microelectronic device 102 and the microelectronic interposer 104, which substantially encapsulates the device-to-interposer interconnects 106. The underfill material 115 may be used to reduce mechanical stress issues that can arise from thermal expansion mismatch and protect component from contamination. The underfill material 115 may be an epoxy material, including, but not limited to epoxy, cyanoester, silicone, siloxane and phenolic based resins, that has sufficiently low viscosity to be wicked between the microelectronic interposer 102 and the microelectronic interposer 104.

The microelectronic interposer 104 and its respective microelectronic interposer conductive routes 118 may be made of multiple layers of conductive traces, such as copper or aluminum, built up on and through dielectric layers, such as epoxy, which may be laminated on either side of the matrix core, such as fiberglass or epoxy. Furthermore, at least one passive device (not shown), such as resistors, capacitors, and inductors, may also be attached to the microelectronic interposer 104, wherein the passive device (s) may be in electrical communication with the microelectronic device 102 through respective microelectronic interposer conductive routes 118.

As further shown in FIG. 1, the microelectronic package 120 may be mounted on a microelectronic substrate 130, which may provide electrical communication routes between the microelectronic package 120 and external components (not shown). The microelectronic package 120 may be attached to the microelectronic substrate 130 through a plurality of interconnects 132, to form a microelectronic structure 100. At least one of the package-to-substrate interconnects 132 may extend between the microelectronic interposer land side bond pads 122 and at least one upper metallization $142_1$ proximate a first surface 136 of the microelectronic substrate 130. The microelectronic substrate upper metallization layer $142_1$ may comprise a plurality of discrete conductive structures and may be a portion of conductive routes (shown as dashed lines 140) on or within the microelectronic substrate 130. The microelectronic substrate conductive routes 140 may provide electrical communication routes to external components (not shown).

Figure 2:
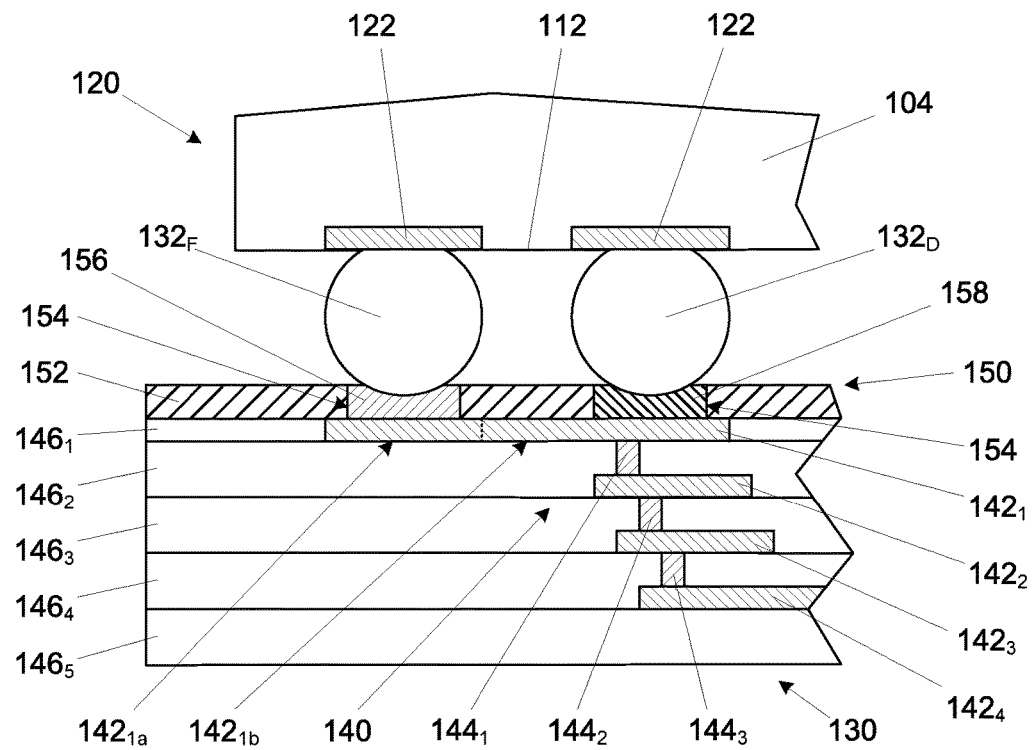
FIG. 2 illustrates a side cross-sectional view of inset A of FIG. 1, according to one embodiment of the present description.

As shown in FIG. 2, the microelectronic substrate 130 may comprise a plurality of dielectric layers $146_1$-$146_5$ and metallization layers $142_1$-$142_4$, such as conductive traces and bond pads, connected with conductive vias $144_1$-$144_3$. The microelectronic substrate 130 may further include a solder resist material structure 150. The solder resist material structure 150 may comprise a solder resist material layer 152 having a plurality of openings 154 extending therethrough, wherein at least one of the plurality of openings 154 may have a conductive material 156 disposed therein and at least one of the plurality openings 154 may have a non-conductive material 158 disposed therein. The plurality of package-to-substrate interconnects 132 of FIG. 1 may include at least one interconnect $132_F$ that is electrically connected with a featured component within the microelectronic package 120 and at least one interconnect $132_D$ that is electrically connect with a de-featured component within the microelectronic package 120, as illustrated in FIG. 2. As further illustrated in FIG. 2, the at least one interconnect $132_F$ that is electrically connected with a featured component within the microelectronic package 120 may electrically contact the conductive material 156 of the solder resist material structure 150, such that it make electrical contact with the upper metallization layer $142_1$, and the at least one interconnect $132_D$ that is electrically connect with a de-featured component within the microelectronic package 120 may electrically contact the non-conductive material 158 of the solder resist material structure 150, such that it does not make electrical contact with the upper metallization layer $142_1$.

As will be understood to those skilled in the art, the solder resist material layer 152 may be utilized to contain the package-to-substrate interconnects 132 during the attachment of the microelectronic package 120 to the microelectronic substrate 130. The solder resist material layer 152 may include, but is not limited to, epoxy resin, epoxy-acrylate resin, and liquid photoimageable materials, which may include silica particle fillers, and/or other inorganic fillers. The conductive material 156 may include any appropriate conductive material, such as a solder material, including, but is not limited to, alloys of tin, copper, silver, lead, bismuth, and/or indium. The non-conductive paste 158 may include any appropriate dielectric material, including, but is not limited to an epoxy material, such as epoxy resin and epoxy-acrylate resin.

Figure 3:
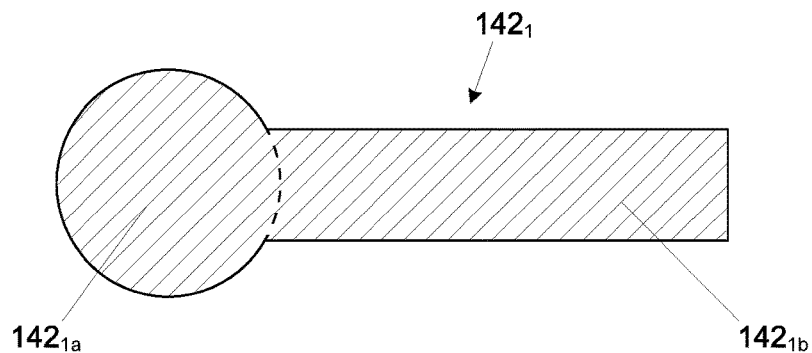
FIG. 3 illustrates a top view of a metallization structure, according to an embodiment of the present description.

As shown in both FIGS. 2 and 3, the upper metallization layer $142_1$ of the microelectronic substrate 130 may comprise a bond pad portion $142_{1a}$ and a trace portion $142_{1b}$. As shown in FIG. 3, which illustrates a top view of the upper metallization layer $142_1$ of the microelectronic substrate 130 of FIG. 2, the bond pad portion $142_{1a}$ may sized/shaped to facilitate the electrical attachment of the featured interconnect $132_F$ and the trace portion $142_{1b}$ which extends under the de-featured interconnect $132_D$ may merely be sized/shaped to electrically connect with the conductive via $144_1$ (see FIG. 2) of the microelectronic substrate 130 (see FIG. 2).

Figure 4:
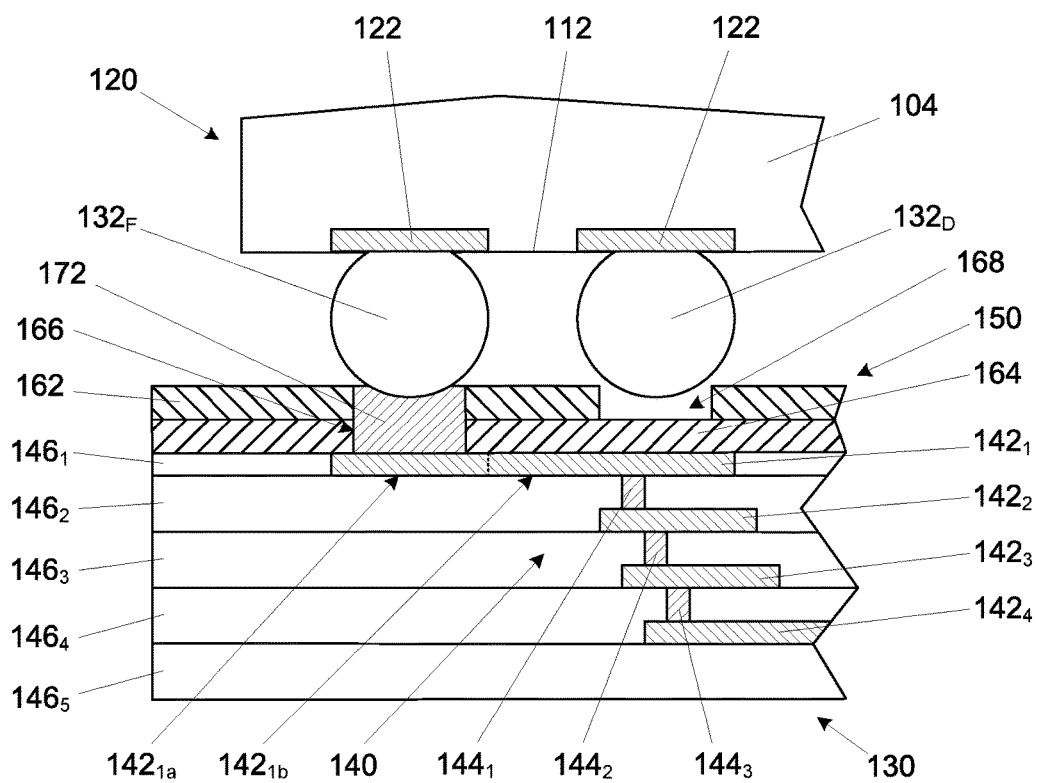
FIG. 4 illustrates a side cross-sectional view of the inset A of FIG. 1, according to another embodiment of the present description.

As shown in FIG. 4, the microelectronic substrate 130 may have a solder resist material structure 150 which comprises an upper solder resist material layer 162 formed on a lower resist material layer 164. The solder resist material structure 150 may include at least one first opening 166 extending through the upper solder resist material layer 162 and the lower solder resist layer 164, wherein the at least one first opening 166 may have a conductive material 172 disposed therein. The solder resist material structure 150 may include at least one second opening 168 extending through the upper solder resist material layer 162, but terminates at the lower solder resist material layer 164. The plurality of package-to-substrate interconnects 132 of FIG. 1 may include at least one interconnect $132_F$ that is electrically connected with a featured component within the microelectronic package 120 and at least one interconnect $132_D$ that is electrically connect with a de-featured component within the microelectronic package 120, as illustrated in FIG. 4. As further illustrated in FIG. 4, the at least one interconnect $132_F$ that is electrically connected with a featured component within the microelectronic package 120 may electrically contact the conductive material 172 of the solder resist material structure 150, such that it make electrical contact with the upper metallization layer $142_1$. The at least one interconnect $132_D$ that is electrically connect with a de-featured component within the microelectronic package 120 may be suspended over the second opening 168 and may have the lower solder resist material layer 164 disposed between the at least one interconnect $132_D$ that is electrically connect with a de-featured component and the upper metallization layer $142_1$ of the microelectronic substrate 130, such that no electrical contact is made. As will be understood to those skilled in the art, the second opening 168 allows space such that the at least one interconnect $132_D$ that is electrically connect with a de-featured component does not contact the solder resist material structure 150 and thereby interfere with the attachment of the at least one interconnect $132_F$ that is electrically connected with a featured component within the microelectronic package 120.

Figure 5:
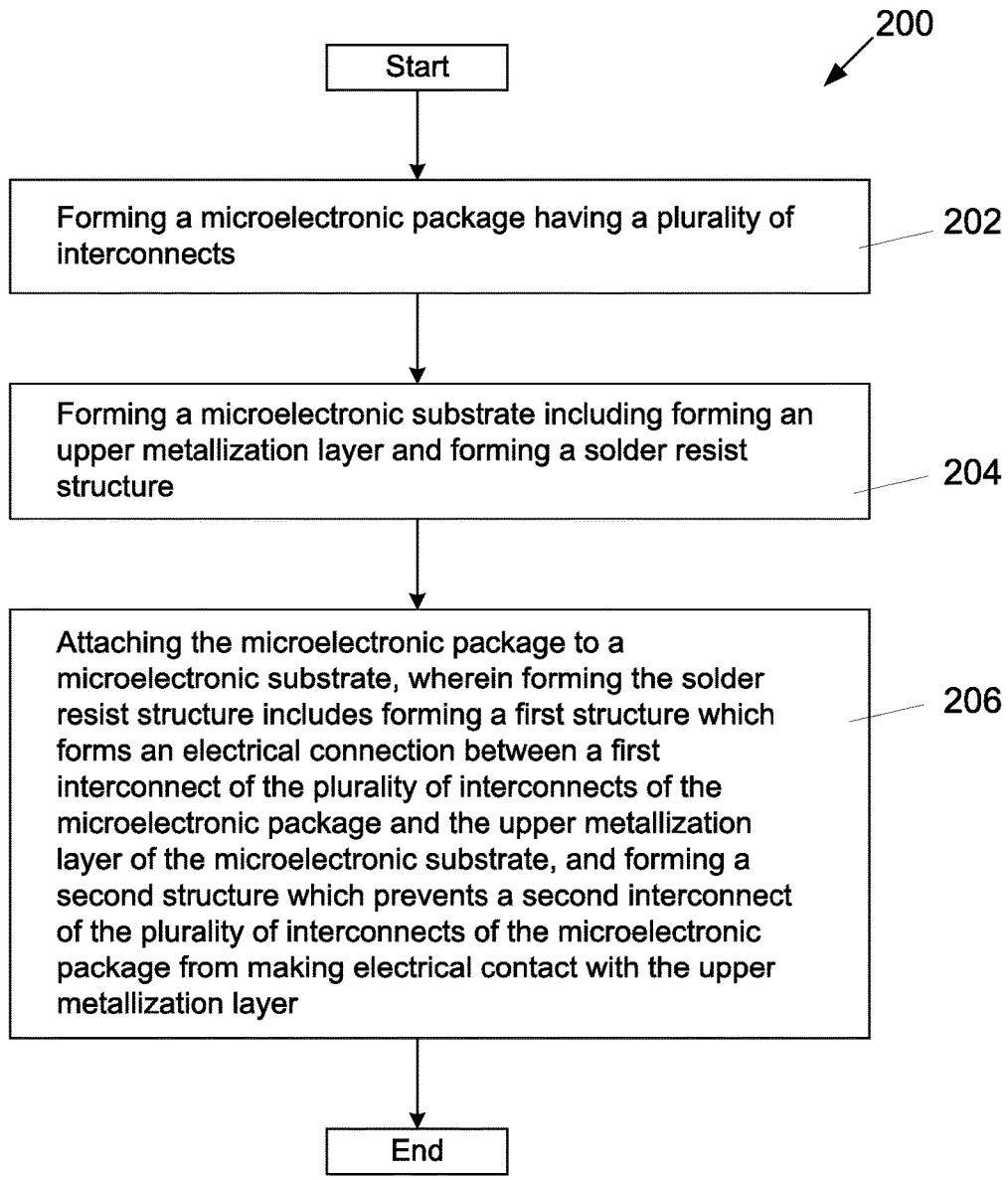
FIG. 5 illustrates a flow diagram of a process for fabrication the microelectronic structure, according to an embodiment of the present description.

FIG. 5 is a flow chart of a process 200 of fabricating a microelectronic structure, according to an embodiment of the present description. As set forth in block 202, a microelectronic package having a plurality of interconnects may be formed. A microelectronic substrate may be formed including forming an upper metallization layer and forming a solder resist structure, as set forth in block 204. As set forth in block 206, the microelectronic package may be attached to the microelectronic structure, wherein forming the solder resist structure includes forming a first structure which forms an electrical connection between a first interconnect of the plurality of interconnects of the microelectronic package and the upper metallization layer of the microelectronic substrate, and forming a second structure which prevents a second interconnect of the plurality of interconnects of the microelectronic package from making electrical contact with the upper metallization layer.

Figure 6:
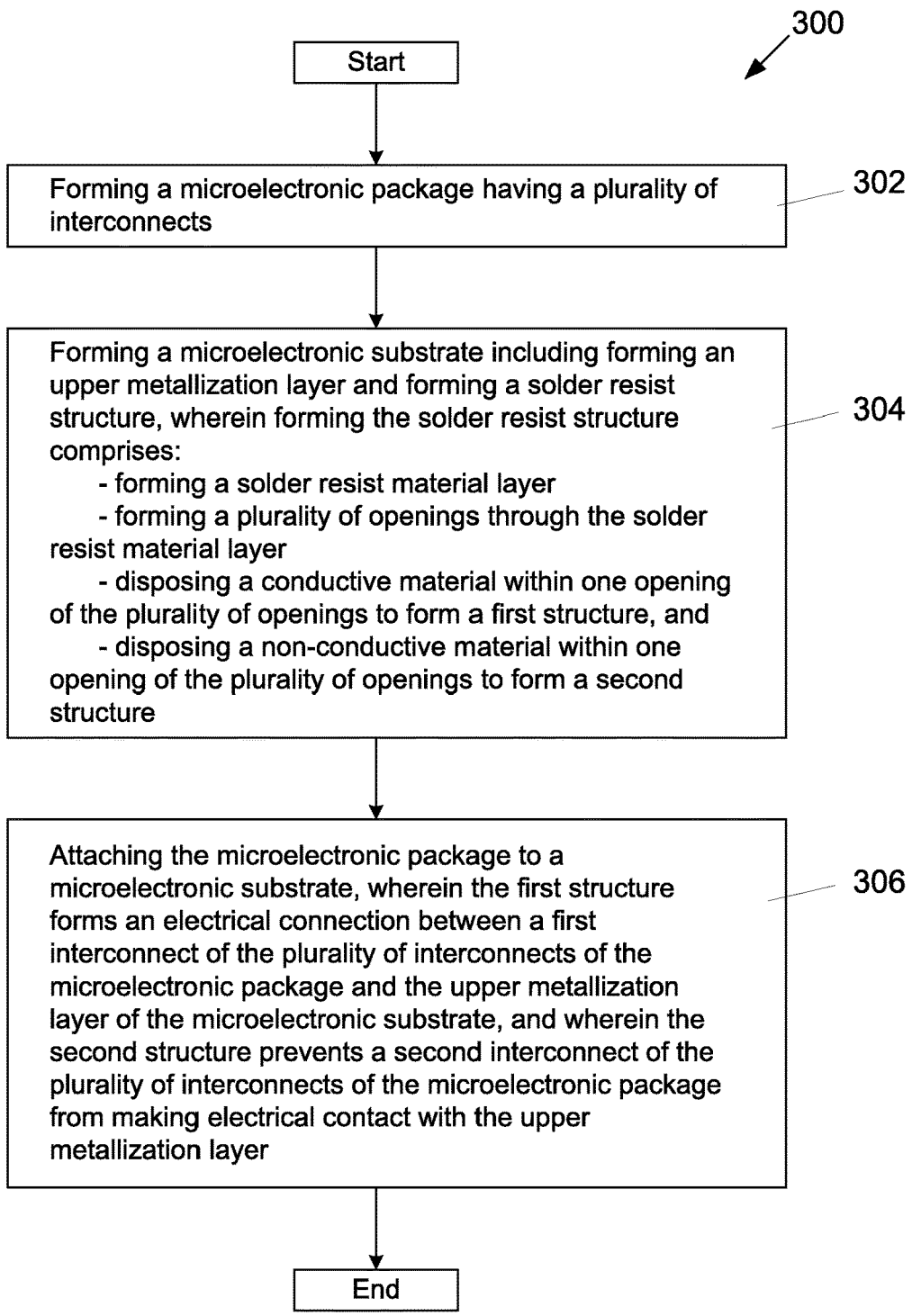
FIG. 6 illustrates a flow diagram of a process for fabrication the microelectronic structure illustrated in FIG. 2, according to an embodiment of the present description.

FIG. 6 is a flow chart of a process 300 of fabricating a microelectronic structure, such as illustrated in FIG. 2, according to an embodiment of the present description. As set forth in block 302, a microelectronic package having a plurality of interconnects may be formed. A microelectronic substrate may be formed including forming an upper metallization layer and forming a solder resist structure, wherein forming the solder resist structure comprises forming a solder resist material layer, forming a plurality of openings through the solder resist material layer, disposing a conductive material within one opening of the plurality of openings to form a first structure, and disposing a non-conductive material within the another opening of the plurality of openings to form a second structure, as set forth in block 304. As set forth in block 306, the microelectronic package may be attached to the microelectronic substrate, wherein the first structure forms an electrical connection between a first interconnect of the plurality of interconnects of the microelectronic package and the upper metallization layer of the microelectronic substrate, and wherein the second structure prevents a second interconnect of the plurality of interconnects of the microelectronic package from making electrical contact with the upper metallization layer.

Figure 7:
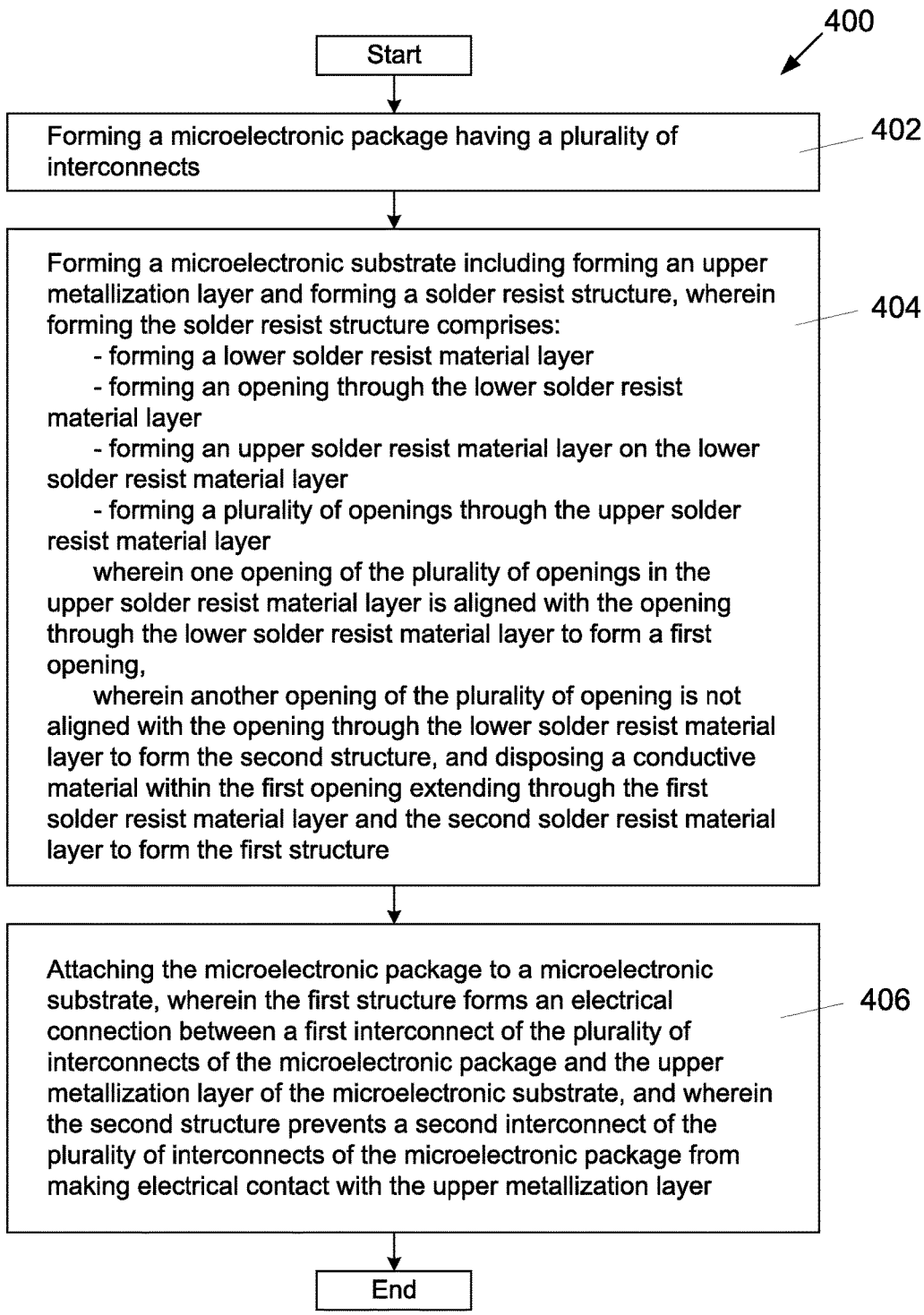
FIG. 7 illustrates a flow diagram of a process for fabrication a microelectronic structure illustrated in FIG. 3, according to an embodiment of the present description.

FIG. 7 is a flow chart of a process 400 of fabricating a microelectronic structure, such as illustrated in FIG. 4, according to an embodiment of the present description. As set forth in block 402, a microelectronic package having a plurality of interconnects may be formed. A microelectronic substrate may be formed including forming an upper metallization layer and forming a solder resist structure, wherein forming the solder resist structure comprises: forming a lower solder resist material layer, forming an opening through the lower solder resist material layer, forming an upper solder resist material layer on the lower solder resist material layer, forming a plurality of openings through the upper solder resist material layer, wherein one opening of the plurality of openings in the upper solder resist material layer is aligned with the opening through the lower solder resist material layer to form a first opening, wherein another opening of the plurality of opening is not aligned with the opening through the lower solder resist material layer to form the second structure, and disposing a conductive material within the first opening extending through the first solder resist material layer and the second solder resist material layer to form the first structure, as set forth in block 404. As set forth in block 406, the microelectronic package may be attached to the microelectronic substrate, wherein the first structure forms an electrical connection between a first interconnect of the plurality of interconnects of the microelectronic package and the upper metallization layer of the microelectronic substrate, and wherein the second structure prevents a second interconnect of the plurality of interconnects of the microelectronic package from making electrical contact with the upper metallization layer.

Figure 8:
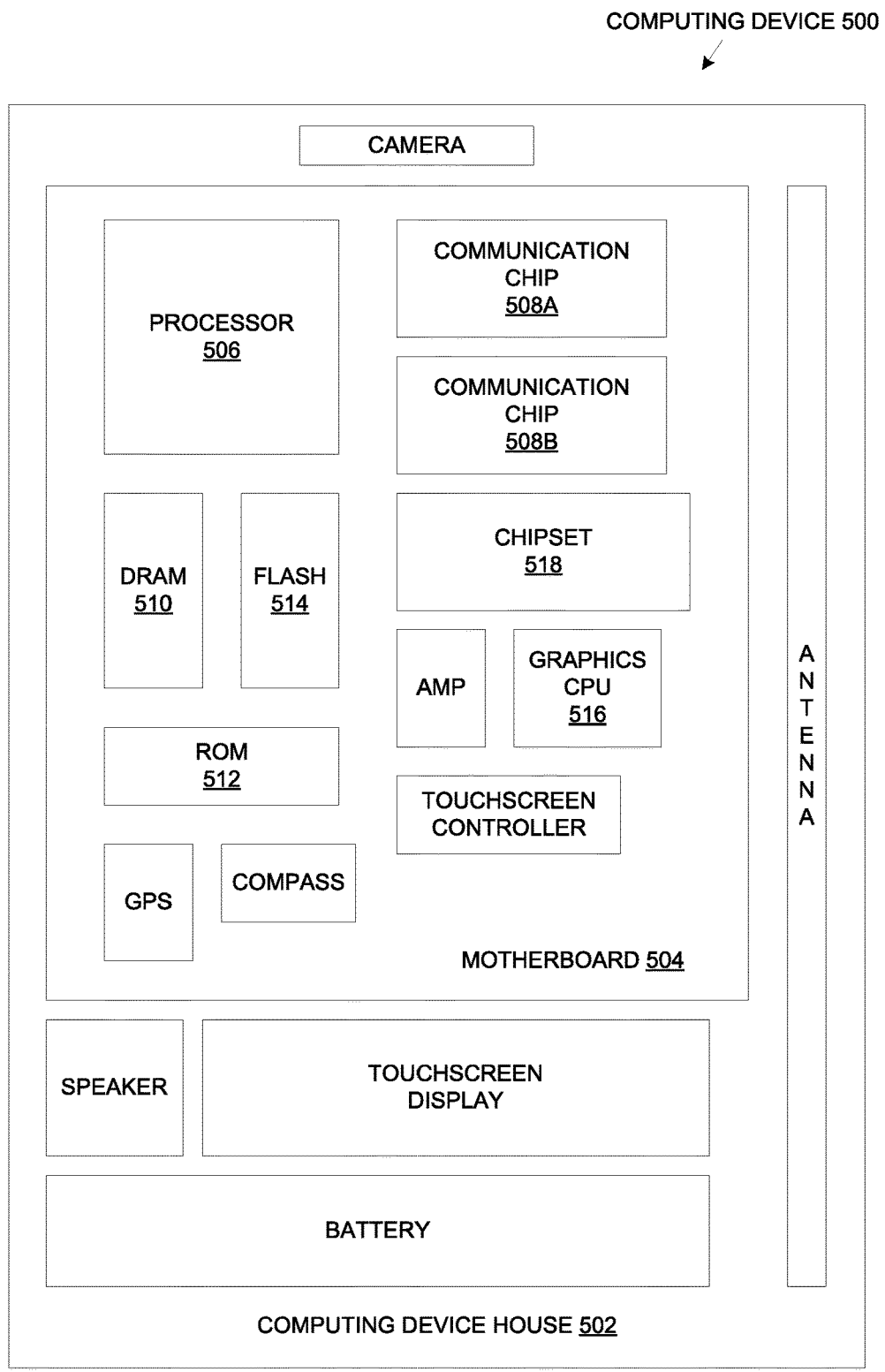
FIG. 8 illustrates an electronic system/device, according to one implementation of the present description.

FIG. 8 illustrates an electronic or computing device 500 in accordance with one implementation of the present description. The computing device 500 has a housing 502 which houses a board 504. The board 504 may include a number of microelectronic components, including but not limited to a processor 506, at least one communication chip 508A, 508B, volatile memory 510 (e.g., DRAM), non-volatile memory 512 (e.g., ROM), flash memory 514, a graphics processor or CPU 516, a digital signal processor (not shown), a crypto processor (not shown), a chipset 518, an antenna, a display, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the microelectronic components may be physically and electrically coupled to the board 504. In some implementations, at least one of the microelectronic components may be a part of the processor 506.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the microelectronic components may include a microelectronic package having a plurality of interconnects, wherein at least one of the plurality of interconnects is a featured interconnect and wherein at least one of the plurality of interconnects is a de-featured interconnect, and a microelectronic substrate including an upper metallization layer and a solder resist structure, wherein the featured interconnect is in electrical contact with the upper metallization layer through the solder resist structure and wherein solder resist structure prevents the de-feature interconnect from making electrical contact with the upper metallization layer.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other microelectronic devices and assembly applications, as well as any appropriate electronic application, as will be understood to those skilled in the art.

The following examples pertain to further embodiments, wherein Example 1 is a microelectronic structure, comprising a microelectronic package having a plurality of interconnects, and a microelectronic substrate including an upper metallization layer and a solder resist structure, wherein the solder resist structure includes a first structure which forms an electrical connection between a first interconnect of the plurality of interconnects of the microelectronic package and the upper metallization layer of the microelectronic substrate, and wherein solder resist structure includes a second structure which prevents a second interconnect of the plurality of interconnects of the microelectronic package from making electrical contact with the upper metallization layer.

In Example 2, the subject matter of Example 1 can optionally include the solder resist structure comprising a solder resist material layer, wherein the first structure comprises a conductive material disposed within a first opening extending through the solder resist material layer, and wherein the second structure comprises a non-conductive material disposed within a second opening extending through the solder resist material layer.

In Example 3, the subject matter of Example 2 can optionally include the first structure contacting the first interconnect and contacting the first metallization layer of the microelectronic substrate.

In Example 4, the subject matter of Example 2 can optionally include the second structure contacting the second interconnect and contacting the first metallization layer of the microelectronic substrate.

In Example 5, the subject matter of Example 2 can optionally include the conductive material being a lead-free solder.

In Example 6, the subject matter of Example 2 can optionally include the non-conductive material being an epoxy material.

In Example 7, the subject matter of Example 1 can optionally include the solder resist structure comprising an upper solder resist material layer formed on a lower solder resist material layer, wherein the first structure comprises a conductive material disposed within a first opening extending through the first solder resist material layer and the second solder resist material layer, and wherein the second structure comprises a second opening extending through the first solder resist material layer and terminating at the lower solder resist material layer.

In Example 8, the subject matter of Example 7 can optionally include the non-conductive material being a lead-free solder.

The following examples pertain to further embodiments, wherein Example 9 is a method of forming a microelectronic structure, comprising forming a microelectronic package having a plurality of interconnects, forming a microelectronic substrate including forming an upper metallization layer and forming a solder resist structure, and attaching the microelectronic package to the microelectronic substrate, wherein forming the solder resist structure includes forming a first structure which forms an electrical connection between a first interconnect of the plurality of interconnects of the microelectronic package and the upper metallization layer of the microelectronic substrate, and forming a second structure which prevents a second interconnect of the plurality of interconnects of the microelectronic package from making electrical contact with the upper metallization layer.

In Example 10, the subject matter of Example 9 can optionally include forming the solder resist structure comprising forming a solder resist material layer, forming a plurality of openings through the solder resist material layer, disposing a conductive material within one opening of the plurality of openings to form the first structure, and disposing a non-conductive material within the another opening of the plurality of openings to form the second structure.

In Example 11, the subject matter of Example 10 can optionally include the first structure contacting the first interconnect and contacting the first metallization layer of the microelectronic substrate.

In Example 12, the subject matter of Example 10 can optionally include the second structure contacting the second interconnect and contacting the first metallization layer of the microelectronic substrate.

In Example 13, the subject matter of Example 10 can optionally include the conductive material being a lead-free solder.

In Example 14, the subject matter of Example 10 can optionally include the non-conductive material being an epoxy material.

In Example 15, the subject matter of Example 1 can optionally include forming the solder resist structure comprises forming a lower solder resist material layer, forming an opening through the lower solder resist material layer, forming an upper solder resist material layer on the lower solder resist material layer, forming a plurality of openings through the upper solder resist material layer; wherein one opening of the plurality of openings in the upper solder resist material layer is aligned with the opening through the lower solder resist material layer to form a first opening, wherein another opening of the plurality of opening is not aligned with the opening through the lower solder resist material layer to form the second structure, and disposing a conductive material disposed within a first opening extending through the first solder resist material layer and the second solder resist material layer to form the first structure.

In Example 16, the subject matter of Example 7 can optionally include the conductive material being a lead-free solder.

The following examples pertain to further embodiments, wherein Example 17 is an electronic system, comprising a housing, a microelectronic substrate disposed within the housing, comprising a microelectronic package having a plurality of interconnects, and a microelectronic substrate including an upper metallization layer and a solder resist structure, wherein the solder resist structure includes a first structure which forms an electrical connection between a first interconnect of the plurality of interconnects of the microelectronic package and the upper metallization layer of the microelectronic substrate, and wherein solder resist structure includes a second structure which prevents a second interconnect of the plurality of interconnects of the microelectronic package from making electrical contact with the upper metallization layer.

In Example 18, the subject matter of Example 17 can optionally include the solder resist structure comprising a solder resist material layer, wherein the first structure comprises a conductive material disposed within a first opening extending through the solder resist material layer, and wherein the second structure comprises a non-conductive material disposed within a second opening extending through the solder resist material layer.

In Example 19, the subject matter of Example 18 can optionally include the first structure contacting the first interconnect and contacting the first metallization layer of the microelectronic substrate.

In Example 20, the subject matter of Example 18 can optionally include the second structure contacting the second interconnect and contacting the first metallization layer of the microelectronic substrate.

In Example 21, the subject matter of Example 18 can optionally include the conductive material being a lead-free solder.

In Example 22, the subject matter of Example 18 can optionally include the non-conductive material being an epoxy material.

In Example 23, the subject matter of Example 17 can optionally include the solder resist structure comprising an upper solder resist material layer formed on a lower solder resist material layer, wherein the first structure comprises a conductive material disposed within a first opening extending through the first solder resist material layer and the second solder resist material layer, and wherein the second structure comprises a second opening extending through the first solder resist material layer and terminating at the lower solder resist material layer.

In Example 24, the subject matter of Example 23 can optionally include the non-conductive material being a lead-free solder.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic structure, comprising:
   a microelectronic package having a plurality of interconnects; and
   a microelectronic substrate including an upper metallization layer completely contained within a dielectric layer and a solder resist structure on the upper metallization layer and the dielectric layer, wherein the solder resist structure comprises a solder resist material layer having a first opening extending through the solder resist material layer, second opening extending through the solder resist material layer, a first structure disposed within the first opening and physically contacting the solder resist material, wherein the first structure forms an electrical connection between a first interconnect of the plurality of interconnects of the microelectronic package and the upper metallization layer of the microelectronic substrate, and a second structure disposed within the second opening and physically contacting the solder resist material, wherein the second structure prevents a second interconnect of the plurality of interconnects of the microelectronic package from making electrical contact with the upper metallization layer wherein the second structure contacts the second interconnect and directly contacts the upper metallization layer of the microelectronic substrate.

2. The microelectronic structure of claim 1, wherein the first structure comprises a conductive material, and wherein the second structure comprises a non-conductive material.

3. The microelectronic structure of claim 2, wherein the conductive material comprises a solder material.

4. The microelectronic structure of claim 2, wherein the non-conductive material comprises an epoxy material.

5. The microelectronic structure of claim 1, wherein the first structure contacts the first interconnect and contacts the upper metallization layer of the microelectronic substrate.

6. A method of forming a microelectronic structure, comprising:
   forming a microelectronic package having a plurality of interconnects;
   forming a microelectronic substrate including forming an upper metallization layer completely contained within a dielectric layer and forming a solder resist structure on the upper metallization layer and the dielectric layer; and
   attaching the microelectronic package to the microelectronic substrate;
   wherein forming the solder resist structure comprises:
      forming a solder resist material layer;
      forming a plurality of openings through the solder resist material layer;
      disposing a conductive material within one opening of the plurality of openings to form a first structure which forms an electrical connection between a first interconnect of the plurality of interconnects of the microelectronic package and the upper metallization layer of the microelectronic substrate and which physically contacts the solder resist material, and
      disposing a non-conductive material within another opening of the plurality of openings to form a second structure which prevents a second interconnect of the plurality of interconnects of the microelectronic package from making electrical contact with the upper metallization layer and which physically contacts the solder resist material wherein the second structure contacts the second interconnect and directly contacts the upper metallization layer of the microelectronic substrate.

7. The method of claim 6, wherein the first structure contacts the first interconnect and contacts the upper metallization layer of the microelectronic substrate.

8. The method of claim 6, wherein the conductive material comprises a solder material.

9. The method of claim 6, wherein the non-conductive material comprises an epoxy material.

10. An electronic system, comprising:
    a housing; and
    a microelectronic structure disposed within the housing, comprising:
       a microelectronic package having a plurality of interconnects; and
       a microelectronic substrate including an upper metallization layer completely contained within a dielectric layer and a solder resist structure on the upper metallization layer and the dielectric layer, wherein the solder resist structure comprises a solder resist material layer having a first opening extending through the solder resist material layer, second opening extending through the solder resist material layer, a first structure disposed within the first opening and physically contacting the solder resist material, wherein the first structure forms an electrical connection between a first interconnect of the plurality of interconnects of the microelectronic package and the upper metallization layer of the microelectronic substrate, and a second structure disposed within the second opening and physically contacting the solder resist material, wherein the second structure prevents a second interconnect of the plurality of interconnects of the microelectronic package from making electrical contact with the upper metallization layer wherein the second structure contacts the second interconnect and directly contacts the upper metallization layer of the microelectronic substrate.

11. The electronic system of claim 10, wherein the first structure comprises a conductive material and wherein the second structure comprises a non-conductive material.

12. The electronic system of claim 11, wherein the conductive material comprises a solder material.

13. The electronic system of claim 11, wherein the non-conductive material comprises an epoxy material.

14. The electronic system of claim 10, wherein the first structure contacts the first interconnect and contacts the upper metallization layer of the microelectronic substrate.

\* \* \* \* \*